United States Patent
Lee

(10) Patent No.: US 9,343,438 B1
(45) Date of Patent: May 17, 2016

(54) SEMICONDUCTOR APPARATUS HAVING MULTIPLE CHANNELS

(71) Applicant: SK hynix Inc., Icheon-si Gyeonggi-do (KR)

(72) Inventor: Hyun Sung Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/711,388

(22) Filed: May 13, 2015

(30) Foreign Application Priority Data

Dec. 22, 2014 (KR) .......................... 10-2014-0186083

(51) Int. Cl.
*H01L 25/065* (2006.01)
*H01L 27/02* (2006.01)

(52) U.S. Cl.
CPC ........ *H01L 25/0657* (2013.01); *H01L 27/0207* (2013.01); *H01L 2225/06544* (2013.01)

(58) Field of Classification Search
CPC ..................... H01L 25/0652; H01L 25/0657
See application file for complete search history.

(56) References Cited

U.S. PATENT DOCUMENTS 8,492,905 B2 * 7/2013 Suh .......................... G11C 5/00
    257/777
8,625,381 B2 * 1/2014 Lee ....................... H01L 23/544
    257/686

FOREIGN PATENT DOCUMENTS

KR     1020140075347 A     6/2014

* cited by examiner

*Primary Examiner* — Jeffrey Zweizig
(74) *Attorney, Agent, or Firm* — William Park & Associates Ltd.

(57) ABSTRACT

A semiconductor apparatus may include a plurality of core chips and a base chip. The plurality of core chips may respectively include a plurality of channels, and each of the plurality of channels may include at least two pseudo channels. Each of the plurality of core chips may include a channel selection unit that selects one or more of the pseudo channels based on a channel mode signal, a pseudo channel signal, a stack information signal, and a slice information signal.

20 Claims, 5 Drawing Sheets

FIG.4
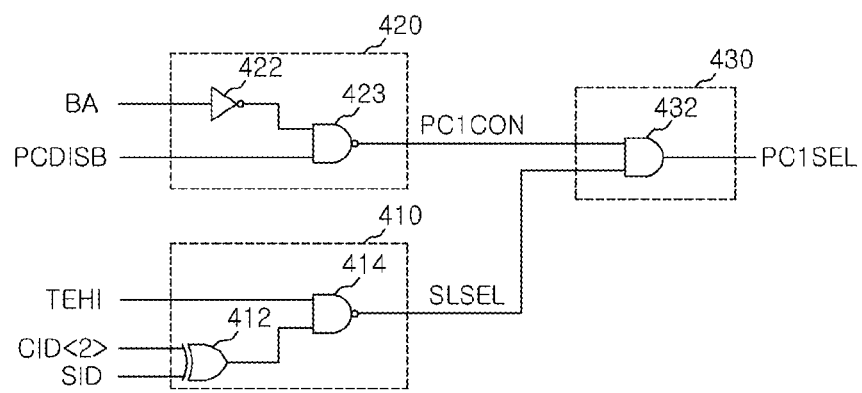
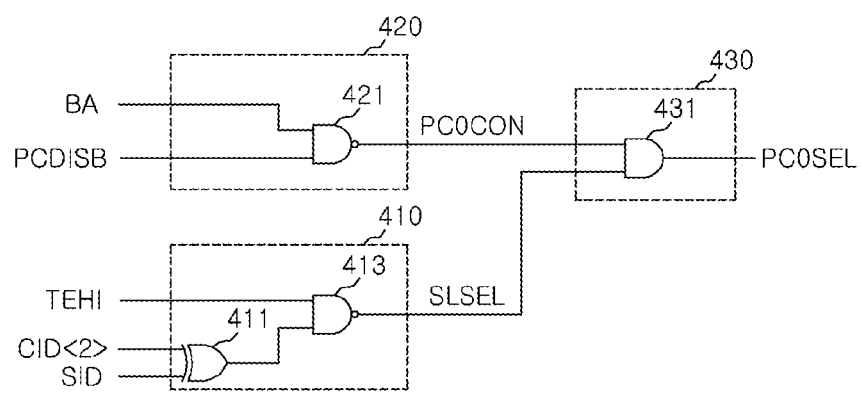

FIG.5

|   | PCDISB | BA | TEHI | CID<2> | SID | PC0SEL | PC1SEL |
|---|--------|----|------|--------|-----|--------|--------|
| A | 0 | X | 0 | X | X | 1 | 1 |
| B | 0 | X | 1 | 0 | 0 | 1 | 1 |
| C | 0 | X | 1 | 0 | 1 | 0 | 0 |
| D | 0 | X | 1 | 1 | 0 | 0 | 0 |
| E | 0 | X | 1 | 1 | 1 | 1 | 1 |
| F | 0 | 0 | 0 | X | X | 1 | 0 |
| G | 1 | 1 | 0 | X | X | 0 | 1 |
| H | 1 | 0 | 1 | 0 | 0 | 1 | 0 |
| I | 1 | 1 | 1 | 0 | 0 | 0 | 1 |
| J | 1 | X | 1 | 0 | 1 | 0 | 0 |
| K | 1 | X | 1 | 1 | 0 | 0 | 0 |
| L | 1 | 0 | 1 | 1 | 1 | 1 | 0 |
| M | 1 | 1 | 1 | 1 | 1 | 0 | 1 | de# SEMICONDUCTOR APPARATUS HAVING MULTIPLE CHANNELS

CROSS-REFERENCES TO RELATED APPLICATION

The present application claims priority under 35 U.S.C. §119(a) to Korean application number 10-2014-0186083 filed on Dec. 22, 2014, in the Korean Intellectual Property Office, which is incorporated herein by reference in its entirety.

BACKGROUND

1. Technical Field

Embodiments of the present invention generally relate to an integrated circuit, and more particularly to a semiconductor apparatus having stacked semiconductor chips with multiple channels.

2. Related Art

To provide highly integrated semiconductor apparatus, manufacturers in the semiconductor industry have continually increased packaging density, which has led to the development of three-dimensional ("3D") semiconductor apparatus. A 3D semiconductor apparatus may include a plurality of chips stacked and packaged in a single package. The 3D semiconductor apparatus achieves the creation of smaller and high-capacity memory modules by vertically stacking two or more semiconductor chips.

The 3D semiconductor apparatus may be manufactured by stacking semiconductor chips and interconnecting them so that they behave as a single semiconductor apparatus.

The vertically-stacked semiconductor chips may be coupled to each other using through-silicon via ("TSV"), which may be formed by penetrating the stacked semiconductor chips. A semiconductor apparatus having the TSV may reduce the package size of the semiconductor apparatus as compared to a wire bonding.

Each of the stacked semiconductor chips operates independent of one another and has channels to receive control signals or data.

SUMMARY

In an embodiment of the present invention, a stacked semiconductor apparatus may include a plurality of core chips respectively including a plurality of channels, each of the plurality of channels including at least two pseudo channels, and a base chip configured to transmit a control signal to the plurality of core chips, wherein each of the core chips may include a channel selection unit configured to select one or more of pseudo channels based on a channel mode signal, a pseudo channel signal, a stack information signal, and a slice information signal.

In an embodiment of the present invention, a stacked semiconductor apparatus may include a plurality of channels respectively including first and second pseudo channels, a slice selection section configured to generates a slice selection signal based on a stack information signal and a slice information signal, a channel selection control section configured to enable first and second channel selection control signals regardless of a pseudo channel signal when the semiconductor apparatus is in a legacy mode, and enable one of the first and second channel selection control signals based on the pseudo channel signal when the semiconductor apparatus is in a pseudo channel mode, and a channel selection signal generation section configured to generate first and second pseudo channel selection signals based on the slice selection signal and the first and second channel selection control signals.

In an embodiment of the present invention, a semiconductor apparatus may include a plurality of vertically-stacked core chips coupled to each other using through-silicon via, each core chip including a plurality of channels, each channel including at least two pseudo channels, and a channel selection unit configured to select one or more channels so that each selected channel operates independently without distinguishing pseudo channel when the semiconductor apparatus is in a legacy mode, and select one or more channels and one or more pseudo channels so that each selected pseudo channel of the selected channel operates independently when the semiconductor apparatus is in a pseudo channel mode.

BRIEF DESCRIPTION OF THE DRAWINGS

FIG. 4 is a diagram illustrating a configuration of a channel selection unit according to an embodiment; and FIG. 5 is a table illustrating an operation of a channel selection unit illustrated in FIG. 4.

DETAILED DESCRIPTION

Figure 1:
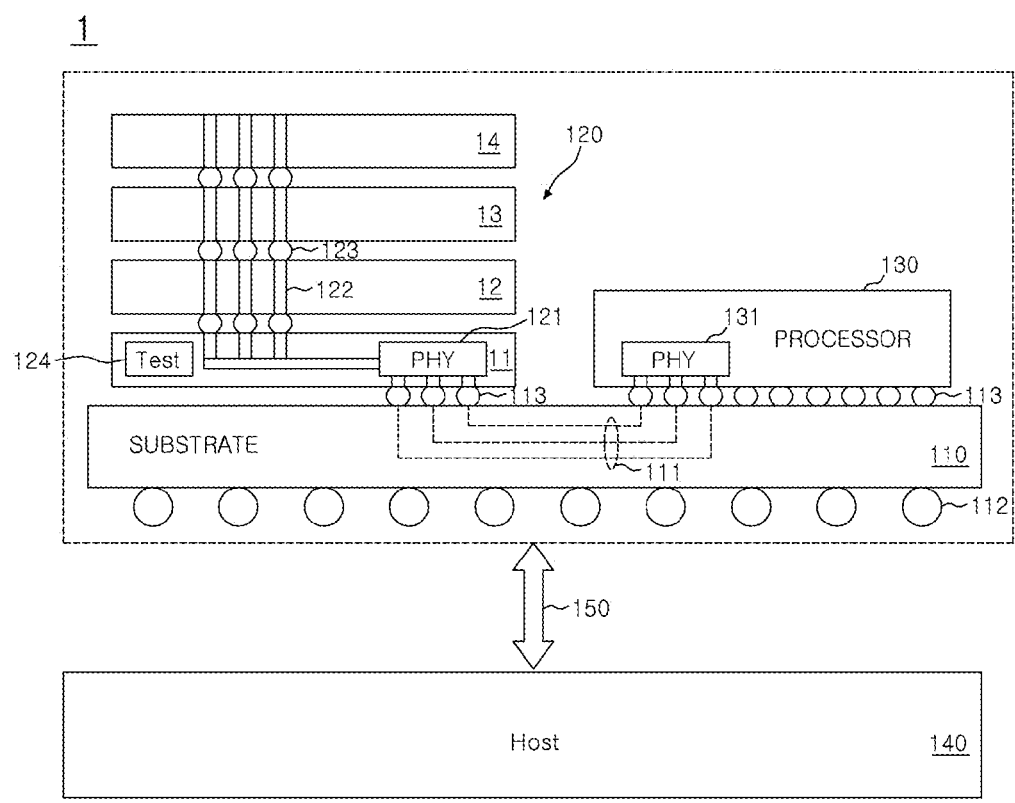
FIG. 1 is a diagram illustrating a configuration of an electronic system having a semiconductor apparatus according to an embodiment.

FIG. 1 is a diagram illustrating a configuration of an electronic system having a semiconductor apparatus according to an embodiment.

Referring to FIG. 1, a substrate 110 may provide signal paths 111 for data communication between a processor 130 and a semiconductor apparatus 120. The substrate 110 may include a logic circuit for controlling data communication through signal paths and a logic circuit for a test. The semiconductor apparatus 120 may include a semiconductor apparatus having stacked semiconductor chips. The substrate 110 may be realized in various forms including an interposer, a PCB and the like. The signal paths 111 may be metal layers or through-silicon vias.

The substrate 110 may be electrically connected to an external apparatus through connection members 112 such as balls, which may be used for ball grid arrays, bumps, and C4 bumps, which may be used for flip chip packages. The external apparatus may include a host 140 that is coupled to the semiconductor apparatus 120 to control the operations of the semiconductor apparatus 120. The substrate 110 may be electrically connected to the processor 130 and the semiconductor apparatus 120 through micro bumps 113.

The processor 130 may communicate with the host 140 through a system bus 150 and the substrate 110, and may perform various calculations and operations required by the host 140. Such a processor 130 may include one or more of a central processing unit ("CPU"), a graphic processing unit ("GPU"), a multimedia processor ("MMP"), a digital signal processor, and a memory controller. The processor 130 may be packaged in a system on chip, a system in package, or a package on package. Further, the processor 130 may be packaged together with other processor chips having various functions such as an application processor ("AP"). The processor 130, which may access the semiconductor apparatus 120, may convert signals, which are exchanged between a physical layer 131 of the processor 130 and a physical layer 121 of the semiconductor apparatus 120, so that each part can receive the signals from the other part.

The semiconductor apparatus 120 may include a base chip 11 and a plurality of core chips 12 to 14 sequentially stacked on the base chip 11. The base chip 11 and the plurality of core chips 12 to 14 may be electrically connected to each other through through-silicon vias 122 and micro bumps 123. The base chip 11 may provide channels for data transmission between the processor 130 and the plurality of core chips 12 to 14. The base chip 11 may include the physical layer 121, a test circuit 124, and a repair-related circuit. The physical layer 121 may receive signals, which may include data, command, and address, transmitted through the physical layer 131 of the processor 130, amplify signals outputted from the plurality of core chips 12 to 14, and transmit the amplified signals to the physical layer 131 of the processor 130. The test circuit 124 may perform a test with respect to the plurality of core chips 12 to 14, and the processor 130 may determine if the plurality of core chips 12 to 14 function properly based on the electrical tests. The test may be performed by an external test equipment or by the test circuit 124 of the base chip 11. The test circuit 124 may include circuits for a wafer-level test and a package-level test. The test circuit 124 may include one or more of a built-in self-test circuit, a self-repair circuit, and a self-stress circuit. For example, the test circuit 124 may perform one or more of a connectivity test of a through-silicon via or a micro bump, a boundary scan test, a burn-in stress test, a data input/output test, and a data compression test. Furthermore, the test circuit 124 may include a repair logic that replaces a failed cell with a redundancy cell. Each of the plurality of core chips 12 to 14 may have a data storage space for storing data transmitted from the processor 130 through the base chip 11.

Figure 2:
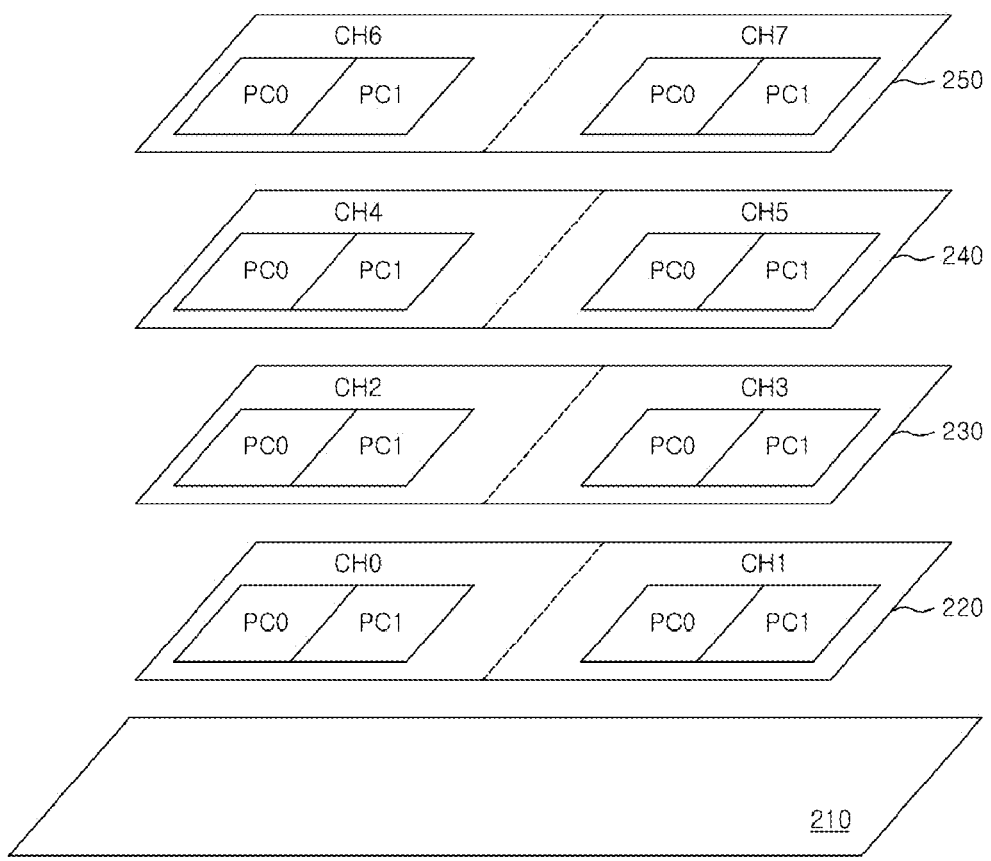
FIG. 2 is a diagram illustrating a configuration of a semiconductor apparatus having stacked semiconductor chips according to an embodiment.

FIG. 2 is a diagram illustrating a configuration of a semiconductor apparatus 2 according to an embodiment. The semiconductor apparatus 2 may have stacked semiconductor chips therein like the semiconductor apparatus 120 illustrated in FIG. 1. In an embodiment, the semiconductor apparatus 2 may include a base chip 210 and a plurality of core chips. The number of core chips can be quite large, but FIG. 2 provides only four core chips as an example. In FIG. 2, the semiconductor apparatus 2 may include first to fourth core chips 220, 230, 240, and 250. The base chip 210 may control the operations of the first to fourth core chips 220, 230, 240, and 250. The base chip 210 may receive a control signal for controlling the operation of the semiconductor apparatus from a processor. The base chip 210 may provide an interface for communication between the processor and the first to fourth core chips 220, 230, 240, and 250.

The first to fourth core chips 220, 230, 240, and 250 may receive the control signal from the base chip 210 to operate in response to the control signal. Each of the first to fourth core chips 220, 230, 240, and 250 may have channels. The channel may include a communication link or a communication medium capable of operating independently. For example, the first core chip 220 may have first and second channels CH0 and CH1, which may operate independently, the second core chip 230 may have third and fourth channels CH2 and CH3, which may operate independently, the third core chip 240 may have fifth and sixth channels CH4 and CH5, which may operate independently, and the fourth core chip 250 may have seventh and eighth channels CH6 and CH7, which may operate independently. In general, one core chip has one channel, but in order to increase a bandwidth of the semiconductor apparatus, one core chip may include a plurality of channels and the plurality of channels may operate independently.

In order to further increase the bandwidth of the semiconductor apparatus 2, each of the first to eighth channels CH0 to CH7 may be subdivided into first and second pseudo channels PC0 and PC1. Each of the first to eighth channels CH0 to CH7 may include the first and second pseudo channels PC0 and PC1. The semiconductor apparatus 2 may operate in one of a legacy mode and a pseudo channel mode. For example, the semiconductor apparatus 2 use eight channels when it is in the legacy mode, and use sixteen channels when it is in the pseudo channel mode. In the legacy mode, the first to eighth channels CH0 to CH7 may form independent channels, and in the pseudo channel mode, the first and second pseudo channels PC0 and PC1 of each of the first to eighth channels CH0 to CH7 may respectively form independent channels. In other words, in the legacy mode, the first and second pseudo channels PC0 and PC1 may operate as single channels, and in the pseudo channel mode, the first and second pseudo channels PC0 and PC1 may respectively serve as independent channels and may operate independently.

Each of the first to fourth core chips 220, 230, 240, and 250 may include a channel selection unit (now shown). The channel selection unit may receive a control signal from the base chip 210, and may generate channel selection signals according to respective operation modes. The channel selection unit may generate signals for selecting the first and second pseudo channels PC0 and PC1 of the first to eighth channels CH0 to CH7 based on the control signal. For example, the channel selection unit may generate signals for selecting any one channel between the first to eighth channels CH0 to CH7 and any one pseudo channel between the first and second pseudo channels PC0 and PC1. The channel selection unit will be described in detail later.

Figure 3:
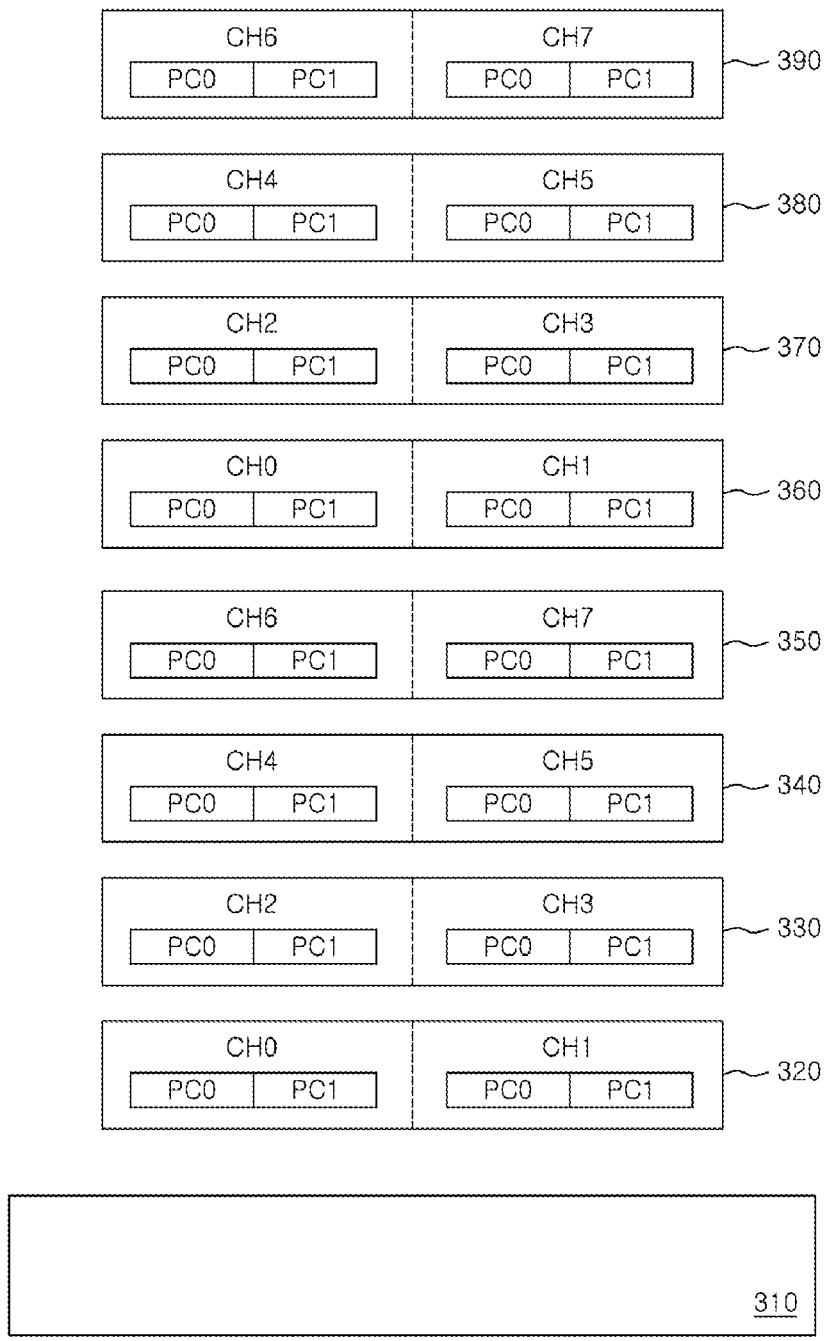
FIG. 3 is a diagram illustrating a configuration of a semiconductor apparatus having stacked semiconductor chips according to an embodiment.

FIG. 3 is a diagram illustrating a configuration of a semiconductor apparatus 3 according to an embodiment. In FIG. 3, the semiconductor apparatus 3 may include a base chip 310 and first to eighth core chips 320, 330, 340, 350, 360, 370, 380, and 390. The semiconductor apparatus 3 may have stacked semiconductor chips therein like the semiconductor apparatus 120 illustrated in FIG. 1. The first to eighth core chips 320, 330, 340, 350, 360, 370, 380, and 390 may be respectively divided into channels and may operate. The first core chip 320 may have first and second channels CH0 and CH1, which may operate independently, the second core chip 330 may have third and fourth channels CH2 and CH3, which may operate independently, the third core chip 340 may have fifth and sixth channels CH4 and CH5, which may operate independently, and the fourth core chip 350 may have seventh and eighth channels CH6 and CH7, which may operate independently. The fifth core chip 360 may have the first and second channels CH0 and CH1, which may operate independently, the sixth core chip 370 may have the third and fourth channels CH2 and CH3, which may operate independently, the seventh core chip 380 may have the fifth and sixth channels CH4 and CH5, which may operate independently, and the eighth core chip 390 may have the seventh and eighth channels CH6 and CH7, which may operate independently. The first core chip 320 and the fifth core chip 360 may form substantially the same channels. Likewise, the second core chip 330 and the sixth core chip 370, the third core chip 340 and the seventh core chip 380, and the fourth core chip 350 and the eighth core chip 390 may form substantially the same channels, respectively.

Each of the first to eighth channels CH0 to CH7 may include first and second pseudo channels PC0 and PC1. In an embodiment, each of the first to eighth core chips 320, 330, 340, 350, 360, 370, 380, and 390 may have two channels and four pseudo channels. FIG. 3 illustrates that each of the first to eighth core chips 320, 330, 340, 350, 360, 370, 380, and 390 have two channels and one channel has two pseudo channels. Each of the first to eighth core chips 320, 330, 340, 350, 360, 370, 380, and 390 may have three or more channels, which may operate independently, and each channel may be subdivided into three or more pseudo channels, which may operate independently.

The semiconductor apparatus 3 may operate in one of a legacy mode and a pseudo channel mode. In the legacy mode, the first and second pseudo channels PC0 and PC1 included in the first to eighth channels CH0 to CH7 may operate as a single channel. In the pseudo channel mode, each of the first and second pseudo channels PC0 and PC1 included in the first to eighth channels CH0 to CH7 may operate as an independent channel, respectively.

Each of the first to eighth core chips 320, 330, 340, 350, 360, 370, 380, and 390 may include a channel selection unit (now shown). The channel selection unit may receive a control signal from the base chip 310, and generate channel selection signals according to respective operation modes. The channel selection unit may generate signals for selecting the first and second pseudo channels PC0 and PC1 of the first to eighth channels CH0 to CH7 based on the control signal. For example, the channel selection unit may generate signals for selecting any one channel between the first to eighth channels CH0 to CH7 and any one pseudo channel between the first and second pseudo channels PC0 and PC1.

FIG. 4 is a diagram illustrating the configuration of a channel selection unit 4 according to an embodiment. In FIG. 4, the channel selection unit 4 may include a slice selection section 410, a channel selection control section 420, and a channel selection signal generation section 430. The slice selection section 410 may generate a slice selection signal SLSEL based on a stack information signal TEHI and slice information signals CID<2> and SID. The stack information signal TEHI may have information on the number of core chips included in the semiconductor apparatus. For example, the stack information signal TEHI may have information regarding whether the semiconductor apparatus includes four core chips or eight core chips. When the semiconductor apparatus includes four core chips, the stack information signal TEHI may be disabled. When the semiconductor apparatus includes eight core chips, the stack information signal TEHI may be enabled.

The slice information signal may include an internal slice information signal CID<2> and an external slice information signal SID. The internal slice information signal CID<2> may be an identification signal of the core chip. A plurality of core chips may have unique identification signals, and the identification signals may be generated by an internal logic circuit. For example, the first core chip 320 illustrated in FIG. 3 may have a signal having a logic level of "000" as the identification signal, and the second core chip 330 may have a signal having a logic level of 001 as the identification signal. Similarly, the third to eighth core chips 340, 350, 360, 370, 380, and 390 may have signals having logic levels of "010," "011," "100," "101," "110," and "111" as the identification signals. Here, "0" refers to a logic low level, and "1" refers to a logic high level. The semiconductor apparatus 3 illustrated in FIG. 3 may be divided into an upper chip corresponding to the fifth to eighth core chips 360, 370, 380, and 390 and a lower chip corresponding to the first to fourth core chips 320, 330, 340, and 350. As described above, the fifth to eighth core chips 360, 370, 380, and 390 constituting the upper chip and the first to eighth core chips 320, 330, 340, and 350 constituting the lower chip may form substantially the same channels, respectively. When the semiconductor apparatus 3 has the eight core chips stacked therein, the slice selection section 410 may generate the slice selection signal SLSEL for selecting the upper layer and the lower chip. In an embodiment, the most significant bit of the identification signals of the respective core chips may be used as the internal slice information signal CID<2>. As described above, the most significant bit of the identification signals of the first to fourth core chips 320, 330, 340, and 350 is "0," and the most significant bit of the identification signals of the fifth to eighth core chips 360, 370, 380, and 390 is "1." In an embodiment, where the external slice information signal SID, which may be transmitted from the base chip 310, has information for selecting one of the upper layer and the lower chip, the upper layer may be selected when the external slice information signal SID has a logic high level and the lower layer may be selected when the external slice information signal SID has a logic low level.

When the stack information signal TEHI is disabled (e.g., when the stack information signal TEHI has a logic low level), the slice selection section 410 may enable the slice selection signal SLSEL regardless of the slice information signals CID<2> and SID. When the stack information signal TEHI is enabled, the slice selection signal SLSEL may be determined based on the slice information signals CID<2> and SID. The channel selection units of the first to fourth core chips 320, 330, 340, and 350 may receive a logic low level as the internal slice information signal CID<2>, and the channel selection units of the fifth to eighth core chips 360, 370, 380, and 390 may receive a logic high level as the internal slice information signal CID<2>. When the external slice information signal SID of logic low level is inputted, the channel selection units of the first to fourth core chips 320, 330, 340, and 350 may enable the slice selection signal SLSEL, and the channel selection units of the fifth to eighth core chips 360, 370, 380, and 390 may disable the slice selection signal SLSEL. However, when the external slice information signal SID of logic high level is inputted, the channel selection units of the first to fourth core chips 320, 330, 340, and 350 may disable the slice selection signal SLSEL, and the channel selection units of the fifth to eighth core chips 360, 370, 380, and 390 may enable the slice selection signal SLSEL.

The channel selection control section 420 may generate first and second channel selection control signals PC0CON and PC0CON based on a channel mode signal PCDISB and a pseudo channel signal BA. The channel mode signal PCDISB may be used to select one of the legacy mode and the pseudo channel mode. For example, when the semiconductor apparatus operates in the legacy mode, the channel mode signal PCDISB may be disabled (e.g., a logic low level). When the semiconductor apparatus operates in the pseudo channel mode, the channel mode signal PCDISB may be enabled (e.g., a logic high level). The pseudo channel signal BA may have information for selecting one of the first and second pseudo channels PC0 and PC1 included in the first to eighth channels CH0 to CH7. For example, the pseudo channel signal BA may use an address signal and a test mode signal. For example, the address signal and the test mode signal may be used as the pseudo channel signal BA. The pseudo channel signal BA may be disabled in order to select the first pseudo channel PC0 and may be enabled in order to select the second pseudo channel PC1.

When the channel mode signal PCDISB is disabled, the channel selection control section 420 may enable the first and second channel selection control signals PC0CON and PC1CON regardless of the pseudo channel signal BA. When the channel mode signal PCDISB is enabled, whether the channel selection control section 420 may enable the first and second channel selection control signals PC0CON and PC1CON is determined depending on the pseudo channel signal BA. When the channel mode signal PCDISB and the pseudo channel signal BA are enabled, the channel selection control section 420 may disable the first channel selection control signal PC0CON and enable the second channel selection control signal PC1CON. When the channel mode signal PCDISB is enabled and the pseudo channel signal BA is disabled, the channel selection control section 420 may enable the first channel selection control signal PC0CON and disable the second channel selection control signal PC1CON.

The channel selection signal generation section 430 may generate first and second pseudo channel selection signals PC0SEL and PC1SEL based on the slice selection signal SLSEL and the first and second channel selection control signals PC0CON and PC1CON. The channel selection signal generation section 430 may generate the first and second pseudo channel selection signals PC0SEL and PC1SEL by combining the slice selection signal SLSEL with the first and second channel selection control signals PC0CON and PC1CON. When the slice selection signal SLSEL is enabled, the channel selection signal generation section 430 may output the first channel selection control signal PC0CON as the first pseudo channel selection signal PC0SEL, and output the second channel selection control signal PC1CON as the second pseudo channel selection signal PC1SEL.

In FIG. 4, the slice selection section 410 may include a first XOR gate 411, a second XOR gate 412, a first NAND gate 413, and a second NAND gate 414. The first XOR gate 411 receives the internal slice information signal CID<2> and the external slice information signal SID. The first NAND gate 413 may receive the output of the first XOR gate 411 and the stack information signal TEHI, and output the slice selection signal SLSEL. The second XOR gate 412 receives the internal slice information signal CID<2> and the external slice information signal SID. The second NAND gate 414 may receive the output of the second XOR gate 412 and the stack information signal TEHI, and output the slice selection signal SLSEL. The channel selection control section 420 may include a third NAND gate 421, a first inverter 422, and a fourth NAND gate 423. The third NAND gate 421 may receive the channel mode signal PCDISB and the pseudo channel signal BA, and output the first channel selection control signal PC0CON. The first inverter 422 may invert the pseudo channel signal BA, and the fourth NAND gate 423 may receive the output of the first inverter 422 and the channel mode signal PCDISB, and output the second channel selection control signal PC1CON. The channel selection signal generation section 430 may include first and second AND gates 431 and 432. The first AND gate 431 may receive the slice selection signal SLSEL and the first channel selection control signal PC0CON, and output the first pseudo channel selection signal PC0SEL. The second AND gate 432 may receive the slice selection signal SLSEL and the second channel selection control signal PC1CON, and output the second pseudo channel selection signal PC1SEL.

FIG. 5 is a table illustrating the operation of the channel selection unit 4 illustrated in FIG. 4. Referring to FIG. 3 to FIG. 5, the operations of the semiconductor apparatuses 2 and 3 according to an embodiments will be described as follows. In an embodiment, when the channel mode signal PCDISB is disabled to a logic low level, the semiconductor apparatuses 2 and 3 may operate in the legacy mode, and the channel selection control section 420 may enable the first and second channel selection control signals PC0CON and PC1CON regardless of the pseudo channel signal BA. In cases where four core chips are stacked in the semiconductor apparatus 2 as shown in FIG. 2, the stack information signal TEHI may be disabled to a logic low level, and the slice selection section 410 may enable the slice selection signal SLSEL regardless of the slice information signals CID<2> and SID. Row "A" of the table in FIG. 5 shows this situation and, the channel selection units of the first to fourth core chips 220, 230, 240, and 250 may enable all the first and second pseudo channel selection signals PC0SEL and PC1SEL. In FIG. 2, when the base chip 210 transmits the control signal to the first channel CH0 in order to operate the first channel CH0, since all the first and second pseudo channels PC0 and PC1 of the first channel CH0 of the first core chip 220 have been selected, the first and second pseudo channels PC0 and PC1 may receive the control signal transmitted from the base chip 210 to operate as a single channel.

In cases where eight core chips are stacked in the semiconductor apparatus 3 as shown in FIG. 3, the stack information signal TEHI may be enabled to a logic high level. When the stack information signal TEHI is enabled, all the first and second pseudo channel selection signals PC0SEL and PC1SEL may be enabled or disabled according to whether the internal slice information signal CID<2> coincides with the external slice information signal SID. When the internal slice information signal CID<2> coincides with the external slice information signal SID, the slice selection signal SLSEL is enabled, and the channel selection unit may enable all the first and second pseudo channel selection signals PC0SEL and PC1SEL. When the internal slice information signal CID<2> does not coincide with the external slice information signal SID, the slice selection signal SLSEL is disabled, and the channel selection unit may disable all the first and second pseudo channel selection signals PC0SEL and PC1SEL. In FIG. 3, when the base chip 310 provides the external slice information signal SID for selecting the lower chip, the channel selection units of the first to fourth core chips 320, 330, 340, and 350 may enable all the first and second pseudo channel selection signals PC0SEL and PC1SEL as shown in row "B" of the table in FIG. 5, and the channel selection units of the fifth to eighth core chips 360, 370, 380, and 390 may disable all the first and second pseudo channel selection signals PC0SEL and PC1SEL as shown in row "D" of the table in FIG. 5. When the base chip 310 transmits the control signal to the first channel CH0 in order to operate the first channel CH0, the first and second pseudo channels PC0 and PC1 of the first channel CH0 of the first core chip 320 may receive the control signal to operate as a single channel. Since the first and second pseudo channel selection signals PC0SEL and PC1SEL for selecting the first and second pseudo channels PC0 and PC1 of the first channel CH0 of the fifth core chip 360 are disabled, the first and second pseudo channels PC0 and PC1 of the first channel CH0 of the fifth core chip 360 may not receive the control signal transmitted from the base chip 310.

When the base chip 310 provides the external slice information signal SID for selecting the upper chip, the channel selection units of the first to fourth core chips 320, 330, 340, and 350 may disable all the first and second pseudo channel selection signals PC0SEL and PC1SEL as shown in row "C" of the table in FIG. 5, and the channel selection units of the fifth to eighth core chips 360, 370, 380, and 390 may enable all the first and second pseudo channel selection signals PC0SEL and PC1SEL as shown in row "E" of the table in FIG. 5. In this case, when the base chip 310 transmits the control signal to the first channel CH0 in order to operate the first channel CH0, the first and second pseudo channels PC0 and PC1 of the first channel CH0 of the fifth core chip 360 may receive the control signal to operate as a single channel. Since the first and second pseudo channel selection signals PC0SEL and PC1SEL for selecting the first and second pseudo channels PC0 and PC1 of the first channel CH0 of the first core chip 320 are disabled, the first and second pseudo channels PC0 and PC1 of the first channel CH0 of the first core chip 320 may not receive the control signal transmitted from the base chip 310.

In cases where the semiconductor apparatus 2 includes four core chips and operates in the pseudo channel mode as illustrated in FIG. 2, the channel mode signal PCDISB may be enabled and the stack information signal TEHI may be disabled. The channel selection control section 420 may enable the first and second pseudo channel selection signals PC0SEL and PC1SEL based on the pseudo channel signal BA, and the slice selection section 410 may enable the slice selection signal SLSEL regardless of the slice information signals CID<2> and SID. When the pseudo channel signal BA is disabled to a logic low level, the channel selection control section 420 may enable the first channel selection control signal PC0CON and disable the second channel selection control signal PC1CON, and the channel selection units of the first to fourth core chips 220, 230, 240, and 250 may enable the first pseudo channel selection signal PC0SEL and disable the second pseudo channel selection signal PC1SEL as shown in row "F" of the table in FIG. 5. However, when the pseudo channel signal BA is enabled to a logic high level, the channel selection units of the first to fourth core chips 220, 230, 240, and 250 may enable the second pseudo channel selection signal PC1SEL and disable the first pseudo channel selection signal PC0SEL as shown in row "G" of the table in FIG. 5. In this case, when the base chip 210 transmits the control signal to the first channel CH0 in order to operate the first channel CH0, only one pseudo channel selected between the first and second pseudo channels PC0 and PC1 of the first channel CH0 of the first core chip 220 receives the control signal to operate.

In cases where the semiconductor apparatus 3 includes eight core chips and operates in the pseudo channel mode as illustrated in FIG. 3, all the channel mode signal PCDISB and the stack information signal TEHI may be enabled. In this case, when the base chip 310 provides the external slice information signal SID for selecting the lower chip, the channel selection units of the first to fourth core chips 320, 330, 340, and 350 may selectively enable one of the first and second pseudo channel selection signals PC0SEL and PC1SEL based on whether the pseudo channel signal BA has been enabled as shown in row "H" and "I" of the table in FIG. 5. The channel selection units of the fifth to eighth core chips 360, 370, 380, and 390 may disable all the first and second pseudo channel selection signals PC0SEL and PC1SEL regardless of the pseudo channel signal BA as shown in row "K" of the table in FIG. 5. When the base chip 310 provides the external slice information signal SID for selecting the upper chip, the channel selection units of the fifth to eighth core chips 360, 370, 380, and 390 may selectively enable one of the first and second pseudo channel selection signals PC0SEL and PC1SEL based on whether the pseudo channel signal BA has been enabled as shown in row "L" and "M" of the table in FIG. 5. The channel selection units of the first to fourth core chips 320, 330, 340, and 350 may disable all the first and second pseudo channel selection signals PC0SEL and PC1SEL regardless of the pseudo channel signal BA as shown in row "3" of the table in FIG. 5. In this case, when the base chip 310 transmits the control signal to the first channel CH0 in order to operate the first channel CH0, only one pseudo channel selected between the first and second pseudo channels PC0 and PC1 constituting the first channel CH0 of one core chip selected between the first and fifth core chips 320 and 360 may receive the control signal to operate.

While certain embodiments have been described above, it will be understood to those skilled in the art that the embodiments described are by way of example only. Accordingly, the semiconductor apparatus having stacked semiconductor chips with multiple channels described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
a plurality of core chips respectively including a plurality of channels, each of the plurality of channels including at least two pseudo channels; and
a base chip configured to transmit a control signal to the plurality of core chips,
wherein each of the core chips comprises:
a channel selection unit configured to select one or more of the pseudo channels based on a channel mode signal, a pseudo channel signal, a stack information signal, and a slice information signal.

2. The semiconductor apparatus according to claim 1, wherein the channel mode signal has information for selecting one mode between a legacy mode and a pseudo channel mode, and
the channel selection unit selects all the pseudo channels when semiconductor apparatus is in the legacy mode, and selects one of the pseudo channels in response to the pseudo channel signal when the semiconductor apparatus is in the pseudo channel mode.

3. The semiconductor apparatus according to claim 1, wherein the stack information signal has information on a number of the plurality of core chips.

4. The semiconductor apparatus according to claim 1, wherein the slice information signal includes an internal slice information signal and an external slice information signal, the internal slice information signal has information on identification signals of the plurality of core chips, and the external slice information signal has information for distinguishing between an upper layer and a lower chip of the plurality of core chips.

5. The semiconductor apparatus according to claim 1, wherein the plurality of core chips include a first core chip, and wherein the first core chip is divided into first and second channels, which operate independently, and the first and second channels respectively include first and second pseudo channels.

6. The semiconductor apparatus according to claim 5, wherein the channel selection unit of the first core chip enables first and second pseudo channel selection signals regardless of the pseudo channel signal when the channel mode signal is disabled, and enables one of the first and second pseudo channel selection signals based on the pseudo channel signal when the channel mode signal is enabled.

7. The semiconductor apparatus according to claim 1, wherein the plurality of core chips include first to fourth core chips, and wherein the first core chip is divided into first and second channels, which operate independently, the second core chip is divided into third and fourth channels, which operate independently, the third core chip is divided into fifth and sixth channels, which operate independently, the fourth core chip is divided into seventh and eighth channels, which operate independently, and wherein the first to eighth channels respectively include first and second pseudo channels.

8. The semiconductor apparatus according to claim 7, wherein each of the channel selection units of the first to fourth core chips enables first and second pseudo channel selection signals of the first to eighth channels regardless of the pseudo channel signal when the channel mode signal is disabled, and enables one of the first and second pseudo channel selection signals of the first to eighth channels based on the pseudo channel signal when the channel mode signal is enabled.

9. The semiconductor apparatus according to claim 1, wherein the plurality of core chips include first to eighth core chips, and wherein the first core chip is divided into first and second channels, which operate independently, the second core chip is divided into third and fourth channels, which operate independently, the third core chip is divided into fifth and sixth channels, which operate independently, the fourth core chip is divided into seventh and eighth channels, which operate independently, the fifth core chip is divided into the first and second channels, which operate independently, the sixth core chip is divided the third and fourth channels, which operate independently, the seventh core chip is divided into the fifth and sixth channels, which operate independently, the eighth core chip is divided into the seventh and eighth channels, which operate independently, and wherein the first to eighth channels of the first to eighth core chips respectively include first and second pseudo channels.

10. The semiconductor apparatus according to claim 9, wherein each of the channel selection units of the first to eighth core chips generates a slice selection signal for selecting one group of chips between the first to fourth chips and the fifth to eighth chips based on the stack information signal and the slice information signal.

11. The semiconductor apparatus according to claim 10, wherein each of the channel selection units of the first to fourth chips or the fifth to eighth chips selected from the first to eighth core chips enables first and second pseudo channel selection signals of the first to eighth channels regardless of the pseudo channel signal when the channel mode signal is disabled, and enables one of the first and second pseudo channel selection signals of the first to eighth channels based on the pseudo channel signal when the channel mode signal is enabled.

12. A semiconductor apparatus comprising:
a plurality of channels respectively including first and second pseudo channels;
a slice selection section configured to generates a slice selection signal based on a stack information signal and a slice information signal;
a channel selection control section configured to enable first and second channel selection control signals regardless of a pseudo channel signal when the semiconductor apparatus is in a legacy mode, and enable one of the first and second channel selection control signals based on the pseudo channel signal when the semiconductor apparatus is in a pseudo channel mode; and
a channel selection signal generation section configured to generate first and second pseudo channel selection signals based on the slice selection signal and the first and second channel selection control signals.

13. The semiconductor apparatus according to claim 12, wherein the slice selection section enables the slice selection signal regardless of the slice information signal when the stack information signal is disabled, and selectively enables the slice selection signal based on the slice information signal when the stack information signal is enabled.

14. The semiconductor apparatus according to claim 12, wherein the slice information signal includes an internal slice information signal and an external slice information signal, the internal slice information signal has information corresponding to an identification signal of a core chip, and the external slice information signal is provided from a base chip.

15. The semiconductor apparatus according to claim 12, wherein the channel selection control section generates the first and second channel selection control signals based on a channel mode signal and the pseudo channel, and the channel mode signal has information on the legacy mode and the pseudo channel mode.

16. The semiconductor apparatus according to claim 12, wherein the channel selection signal generation section disables the first and second pseudo channel selection signals regardless of the first and second channel selection control signals when the slice selection signal is disabled, and enables the first and second pseudo channel selection signals based on the first and second channel selection control signals when the slice selection signal is enabled.

17. A semiconductor apparatus comprising:
a plurality of vertically-stacked core chips coupled to each other using through-silicon via, each core chip including a plurality of channels, each channel including at least two pseudo channels; and
a channel selection unit configured to select one or more channels so that each selected channel operates independently without distinguishing pseudo channel when the semiconductor apparatus is in a legacy mode, and select one or more channels and one or more pseudo channels so that each selected pseudo channel of the selected channel operates independently when the semiconductor apparatus is in a pseudo channel mode.

18. The semiconductor apparatus according to claim 17, wherein the channel selection unit includes:
a slice selection section configured to generates a slice selection signal based on a stack information signal and a slice information signal;
a channel selection control section configured to enable first and second channel selection control signals regardless of a pseudo channel signal when the semiconductor apparatus is in a legacy mode, and enable one of the first and second channel selection control signals based on the pseudo channel signal when the semiconductor apparatus is in a pseudo channel mode; and
a channel selection signal generation section configured to generate first and second pseudo channel selection signals based on the slice selection signal and the first and second channel selection control signals.

19. The semiconductor apparatus according to claim 18, wherein the slice selection section enables the slice selection signal regardless of the slice information signal when the stack information signal is disabled, and selectively enables the slice selection signal based on the slice information signal when the stack information signal is enabled.

20. The semiconductor apparatus according to claim 18, wherein the channel selection signal generation section disables the first and second pseudo channel selection signals regardless of the first and second channel selection control signals when the slice selection signal is disabled, and enables the first and second pseudo channel selection signals based on the first and second channel selection control signals when the slice selection signal is enabled.

* * * * *